United States Patent
Lee et al.

(10) Patent No.: US 7,026,032 B2
(45) Date of Patent: Apr. 11, 2006

(54) POLYIMIDE BASED COMPOSITIONS USEFUL AS ELECTRONIC SUBSTRATES, DERIVED IN PART FROM (MICRO-POWDER) FLUOROPOLYMER, AND METHODS AND COMPOSITIONS RELATING THERETO

(75) Inventors: Yueh-Ling Lee, Princeton, NJ (US); Gary Min, Grove City, OH (US)

(73) Assignee: E. I. du Pont de Nemours and Company, Wilmington, DE (US)

( * ) Notice: Subject to any disclaimer, the term of this patent is extended or adjusted under 35 U.S.C. 154(b) by 119 days.

(21) Appl. No.: 10/702,754

(22) Filed: Nov. 5, 2003

(65) Prior Publication Data

US 2005/0096429 A1    May 5, 2005

(51) Int. Cl.
*B32B 27/06*    (2006.01)
*B32B 5/14*    (2006.01)

(52) U.S. Cl. .................. 428/98; 361/600; 428/221; 428/473.5; 439/607; 524/430; 524/538; 525/180

(58) Field of Classification Search ............... 525/180; 428/473.5, 98, 221; 524/430, 538; 361/600; 439/607
See application file for complete search history.

(56) References Cited

U.S. PATENT DOCUMENTS

| 4,749,752 | A |   | 6/1988 | Youlu et al. |
| 4,816,516 | A |   | 3/1989 | Yamaya et al. |
| 4,942,007 | A | * | 7/1990 | Kunimoto et al. .......... 264/122 |
| 5,087,680 | A |   | 2/1992 | Duan et al. |
| 5,753,358 | A |   | 5/1998 | Korleski |
| 5,766,750 | A |   | 6/1998 | Korleski |
| 5,879,794 | A |   | 3/1999 | Korleski, Jr. |

FOREIGN PATENT DOCUMENTS

| EP | 0 736 568 A1 |   | 10/1996 |
| EP | 1 055 708 A1 |   | 11/2000 |
| JP | 04-328161 | * | 11/1992 |
| WO | WO 02/03397 A2 |   | 1/2002 |

* cited by examiner

*Primary Examiner*—Ana Woodward

(57) ABSTRACT

The present invention is a polymeric composite comprising a polyimide component and a fluoropolymer component derived from a micro powder. The fluoropolymer micro powder has a melt point between 250 and 375° C. The fluoropolymer micro powder has an average particle size between 20 and 5000 nanometers (5.0 microns).

The polyimide component and the fluoropolymer component are inter-mixed at a high dispersion level where the fluoropolymer component is present in a weight ratio from 10 to 60 percent. The polymeric composite of these two components is particularly useful in the form of a thin film used in high-speed digital circuitry or high signal integrity for low loss of a digital signal. The film can also be used as a wire wrap, or as a coverlay or base film substrate for flexible circuitry laminates.

23 Claims, No Drawings

POLYIMIDE BASED COMPOSITIONS USEFUL AS ELECTRONIC SUBSTRATES, DERIVED IN PART FROM (MICRO-POWDER) FLUOROPOLYMER, AND METHODS AND COMPOSITIONS RELATING THERETO

BACKGROUND OF THE INVENTION

1. Field of the Invention

The present invention relates generally to polymeric blend compositions having at least one polyimide domain and at least one fluoropolymer domain. More specifically, the compositions of the present invention are created by incorporating fluoropolymer micro powder into a polyamic acid (which is a polyimide precursor material) and processing the combination into a polyimide-fluoropolymer blend without undue separation between the two components.

2. Discussion of the Related Art

Broadly speaking, polymer alloys and composites are known. However, such compositions can be problematic, due to incompatibility between one or more polymeric components. Such incompatibility can create undesirable voids, due to separation between incompatible polymeric components, and such separation can diminish product consistency and mechanical performance, while (undesirably) increasing water absorption properties.

U.S. Pat. No. 4,816,516 to Yamaya, et al. teach a method of creating fluoropolymer/polyimide resins for thermoplastic molding and similar-type applications. There is a need however for fluoropolymer-polyimide compositions suitable for high performance, electronics-type applications.

BRIEF SUMMARY OF THE INVENTION

The compositions of the present invention are generally well suited for use as a substrate for electronics type applications, such as, a laminate layer or other support substrate for integrated circuits or the like (e.g., a flexible circuit board) or as a wire wrap for wire, cable or other similar-type electrical conductor material. The polyimide-fluoropolymer polymeric blend compositions of the present invention have a processing temperature of greater than or equal to 300, 325, 350, 375, or 400° C.

The polymeric blends are created by incorporating microscopic fluoropolymer powders into a polyamic acid (the polyamic acid is a precursor material in the synthesis of the polyimides of the present invention), and processing the (micro powder filled) polyamic acid in a high temperature conversion (i.e. imidization process).

The resulting polyimide based composition comprises continuous and/or discontinuous domains of fluoropolymer integrated into the polyimide. During processing of the polyamic acid solution (to ultimately obtain a polyimide base matrix), a disproportionate amount of fluoropolymer (blended into the polyamic acid solution as a micro-powder) will tend to bloom or migrate to the surface of the blend. Such fluoropolymer migration is believed to be aided by the small size of the fluoropolymer micro-powder and also:

i. by the migration of the polyamic acid solvent away from the composition during processing, such as by means of heat and/or mechanical manipulation (e.g., casting the composition into a film and/or stretching it during processing); and/or ii. by processing the composition at a temperature above the fluoropolymer softening point, causing it to be more flowable or semi-flowable, and thereby better enabling the lower surface energy fluoropolymer component (in comparison to the relatively higher surface energy polyamic acid or polyimide component) to reach a more thermodynamically preferred state at the surface of the blend (generally speaking, lower surface energy components tend to bloom to the surface when mixed with higher surface energy components, where migration between the two components is possible).

The fluoropolymer micro powders of the present invention are hereby further defined as:

i. having an average particle size in a range between and including any two of the following average particle sizes (in microns): 5, 4, 3, 2, 1, 0.8, 0.6, 0.5, 0.4, 0.3, 0.2, 0.1, 0.08, 0.06, 0.04, or 0.02 microns (i.e. 20 nanometers);

ii. having a melting temperature less than or equal to 375, 370, 365, 350, 325, 300, 280, 275, 265 or 250° C.; and iii. having a loading between and including any two of the following: 9, 10, 15, 20, 25, 30, 25, 40, 45, 50, 55, 60, 65, 70, 75, 80, 90, 95, 100, 110 and 120 weight parts per 100 weight parts polyimide.

In a preferred embodiment, a fluoropolymer micro-particle loading level is selected to provide a composite film having at least 50, 55, 60, 65, 70, 75, 80, 85, 90, 92, 94, 95, 96, 97, 98, 99 or 100% of the film surface defined by a continuously connected fluoropolymer phase, with an average fluoropolymer phase thickness at the surface of greater than 0.5, 0.75, 1, 2, 3, 4, or 5 microns, at least 90, 95, 96, 97, 98, 99 or 100 weight percent of the fluoropolymer phase at the surface being derived from fused and elongated fluoropolymer micro-particles.

DETAILED DESCRIPTION OF THE PREFERRED EMBODIMENT(S)

The composite materials of the present invention provide many useful properties of both a fluoropolymer and a polyimide. Advantageous properties generally associated with fluoropolymers include low loss (digital signal loss and signal integrity), low dielectric constant, low water absorption, chemical resistance, and the ability to bond with metal. Advantageous polyimide type properties include tough mechanical strength, high glass transition temperature, resistance to chemical and thermal degradation, and high dielectric strength.

At least a portion of the fluoropolymer component of the present invention is derived from micro-powdered fluoropolymer. In one embodiment, the fluoropolymer is incorporated into the polyimide only in micro-powder form, and the fluoropolymer has an average particle size from 20 nanometers to 5.0 microns.

Useful fluoropolymer micro powders of the present invention also have a melt point temperature between 250° C. and 375° C. In one embodiment, the melt point temperature is preferably between (and including) any two of the following numbers 280, 285, 290, 295, 300, 305, 310, 315, 320, 325, 330, 340, 345 and 350° C.

The micro powders of the present invention can be dispersed in the polyimide component in an amount ranging from 10 to 60 weight percent, based upon total weight of the final composition. In one embodiment, the weight percent of fluoropolymer component (based upon total weight of polyimide component and fluoropolymer component) is between 30 to 50 weight percent, depending on the molecular weight and surface morphology of the fluoropolymer micro powder chosen.

When in the form of a thin film, the compositions of the present invention will generally have two or more discrete polymer phases. In one embodiment, the first phase will be a continuous (or substantially continuous) phase of fluoropolymer located along at least one film surface, and in such an embodiment, a disproportionate amount of fluoropolymer component will be located at the surface. Also in such an embodiment, the second phase can be described as a core layer defining a continuous (or substantially continuous) layer of predominantly (at least 50, 60, 70, 80, 85, 90, 95, 97, 98, 99, or 100 percent) polyimide. In such an embodiment, the fluoropolymer phase (or domain) at the surface will be a percentage of the overall thickness of the substrate in a range between and including any two of the following percentages: 0.04, 0.05, 0.1, 0.2, 0.3, 0.4, 0.5, 1, 2, 3, 4, 5, 6, 7, 8, 9, 10, 11 and 12 percent, with at least 50, 60, 70, 80, 90, 95, 96, 97, 98, 99 or 100 percent of the remainder being the core layer of (predominately) polyimide.

In one embodiment, the substrates of the present invention have a total thickness in a range between and including any two of the following: 10, 20, 30, 40, 50, 60, 70, 80, 90, 100, 110, 120, 130, 140, 150, 160, 170, 180, 190 and 200 microns. In another embodiment, at least 20, 30, 40, 50, or 60 weight percent of the substrate is a single continuous phase or fluoropolymer component or polyimide component. In yet another embodiment at least 40, 50, 60, 70, or 80 weight percent of the substrate is defined by two discrete continuous phases of these two components.

In contrast to many known films, the films of the present invention have a relatively thin layer of continuous (or substantially continuous) fluoropolymer component at the surface of the film that is generally not discrete, but relatively integrated with the (substantially polyimide) core layer. The films of the present invention: (1) can be produced in a single step, (2) can have a much thinner layer of fluoropolymer component at the surface of the film than conventionally coated or laminated fluoropolymer/polyimide films, and (3) can posses a fluoropolymer component layer at the surface of the film that is more physically integrated, at least on a molecular level, with the core layer.

In one embodiment, the high concentration of fluoropolymer component at the surface of a composite film (of the present invention) can be used as a 'barrier' layer. Such a barrier can improve resistance to water absorption (or water take-up), relative to many pure polyimides, especially traditional thermosetting polyimides. Indeed, films of the present invention can have water absorption values in a range between and including any two of the following: 0.1, 0.2, 0.3, 0.4, 0.5, 0.6, 0.7, 0.8, 0.9, 1.0, 1.1, 1.2, 1.3, 1.4, 1.5, 1.6, 1.7, and 1.75 percent, depending upon the size and amount of fluoropolymer micro powder used as a filler in the polyimide.

In one embodiment, the amount of fluoropolymer component used in accordance with the present invention is in a range of from 10 to 60 weight percent (based upon total weight of fluoropolymer and polyimide), and depending upon the desired end use properties, can be used in a range from 30 to 50 weight percent. If the fluoropolymer component is below 10 weight percent, the surface of the composite film may not show improved moisture resistance or adequate bond strengths to metal. If the amount of fluoropolymer component exceeds 60 weight percent (or 120 parts fluoropolymer per 100 parts polyimide), the film will have low mechanical strength.

In one embodiment, the fluoropolymer micro-powder component and polyimide precursor (i.e. the polyamic acid solution) are initially combined and subjected to sufficient shear and temperature to eliminate or otherwise minimize unwanted fluoropolymer micro powder agglomeration (segregation), thereby dispersing the fluoropolymer component into the polyamic acid component with fluoropolymer domains of less than 5 microns, and depending upon the particular embodiment chosen, less than or equal to any of the following domain sizes (in microns): 5, 4, 3, 2.5, 2, 1, 0.5, 0.2, 0.1, 0.05, 0.02 microns. Once interspersed to such a level, the polyamic acid can then be processed according to traditional methods (for processing polyamic acid solutions into polyimides, particularly polyimide films). It has been discovered that the final polyimide product will generally have superior phase inter-penetration between the polyimide and fluoropolymer, than when larger particles of fluoropolymer are dispersed into the polyimide.

If the melt point temperature of the fluoropolymer component is less than 250° C., the fluoropolymer may tend to soften too much (or degrade) during polyimide film manufacturing (particularly during casting and curing) making the film difficult to manage (i.e. peel from a casting surface). If the melt point temperature is above 375° C., the fluoropolymer component may not melt or soften to a sufficient degree. During film manufacture, this can impede the formation of a continuous (predominantly fluoropolymer) phase of fluoropolymer component at the surface of the blend film.

In one embodiment, the fluoropolymer phase provides improved (lamination) bonding strength of the film to other materials such as metal foils and electrical conductors like copper wire, while the also providing excellent cohesive strength between the fluoropolymer phase and core layer phase, which can oftentimes increase the composite's overall mechanical strength.

The present invention is not intended to be limited to only two polymer systems. Optionally, additional polymers can be used in accordance with the present invention. Such optional additional polymers may have "fluoro" moieties, "imide" moieties or may be devoid of both such moieties so long as they are compatible with either one of the required polymer components of the present invention.

The weight ratio of fluoropolymer micro powder component to polyimide component can represented by the ratio A to B (A:B), where A is the fluoropolymer component and B is the polyimide component. In accordance with the present invention, A is a range between and including any two of the following weight parts: 10, 15, 20, 25, 30, 35, 40, 45, 50, 55 and 60, and B is a range between and including any two of the following weight parts: 90, 85, 80, 75, 70, 65, 60, 55, 50, 45, or 40. In one embodiment, the amount of fluoropolymer micro powder component in the final composition is at least 30, 32, 34, 36, 38, 40, 42, 44, 46, 48 or 50 weight percent of the entire final composition.

In one embodiment, the initial mixing of the polyimide component (a polyamic acid) and the fluoropolymer component (a fluoropolymer micro powder dispersed in a compatible solvent), is conducted using typical high shear mixing techniques. This provides for an inter-dispersed composition having a blended structure with few or no voids. The blended composition is then heated (and optionally, curing additives are added) to accelerate the chemical reactions of the polyamic acid. The heating thereby increasing the overall viscosity of the material and thereby inhibits phase separation. Once the shear is removed, the blend is cast into a sheet or film. In this embodiment, the viscosity of the blend should generally not be driven to such a high level that casting of the composition is difficult or impossible. Ordinary skill and experimentation may be necessary in blending and casting compositions of the present invention, depending upon the particular polyamic acid chosen pursuant to any particular embodiment of the present invention.

Although the fluoropolymer component is dispersed into the polyamic acid solution in domains less than 5 microns, the final product does not necessary have such small fluoropolymer domains, and indeed, in some embodiments, it is preferred that the small fluoropolymer domains migrate to the surface of the composition and fuse together to form a larger domain, including a substantially continuous coating on the surface of the substrate.

Films in accordance with the present invention generally have high mechanical toughness as well as high dielectric strength. In embodiments where the surface of the film has a high concentration of fluoropolymer, the composite films of the present invention can oftentimes easily be bonded to other materials such as a metal foil, a metal wire, other films, or materials.

The molecular weight of the fluoropolymer can be important, particularly concerning the degree of (preferably high) metal adhesion, (preferably low) water absorption and (preferably low) dissipation loss, which is particularly important when compositions of the present invention are used as a substrate to support electronic circuitry. Generally speaking, lower molecular weight fluoropolymers (e.g. DuPont® MP-1000 and 1100) are more easily blended with the polyimide and will produce a film with lower water absorption and lower dissipation loss (with dissipation loss being typically in the range of from 0.0005 to 0.0020 at 1 MHz). However, at the same loading weight percent fluoropolymer, higher molecular weight fluoropolymers (e.g. DuPont® MP-1500 and 1600) will tend to produce a blended film with higher mechanical peel strength if the film is later bonded to a metal layer. Ordinary skill and experimentation may be necessary in optimizing any particular film for any particular application in accordance with the present invention, depending upon the required (low) water absorption and (low) dissipation loss verses the desired metal adhesion.

For purposes of the present invention, the term fluoropolymer is intended to mean any polymer having at least one, if not more, fluorine atoms contained within the repeating unit of the polymer structure. The term fluoropolymer, or fluoropolymer component, is also intended to mean a fluoropolymer resin (i.e. a fluoro-resin). Commonly, fluoropolymers are polymeric material containing fluorine atoms covalently bonded to, or with, the repeating molecule of the polymer. Common fluoropolymer components of the present invention include:

1. "PFA" is a poly(tetrafluoroethylene-co-perfluoro[alkyl vinyl ether]), including variations or derivatives thereof, having the following moiety representing at least 50, 60, 70, 80, 85, 90, 95, 96, 97, 98, 99 or about 100 weight percent of the entire polymer:

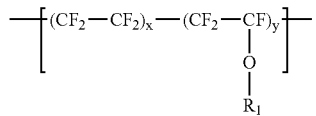

2. where $R_1$ is $C_nF_{2n+1}$, where n can be any natural number equal to or greater than 1 including up to 20 or more, typically n is equal to 1 to three,
    where x and y are mole fractions, where x is in a range from 0.95 to 0.99, typically 0.97, and where y is in a range from 0.01 to 0.05, typically 0.03, and
    where the melt flow rate, described in ASTM D 1238, is in a range of from 1 to 100 (g/10 min.), preferably 1 to 50 (g/10 min.), more preferably, 2 to 30 (g/10 min.), and most preferably 5 to 25 (g/10 min.).

3. "FEP" is a poly(tetrafluoroethylene-co-hexafluoropropylene) [a.k.a. poly(tetrafluoroethylene-co-hexafluoropropylene) copolymer], derived in whole or in part from tetrafluoroethylene and hexafluoropropylene, including variations or derivatives thereof, having the following moiety representing at least 50, 60, 70, 80, 85, 90, 95, 96, 97, 98, 99 or about 100 weight percent of the entire polymer:

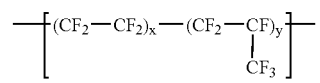

where x and y are mole fractions, where x is in a range from 0.85 to 0.95, typically 0.92, and where y is in a range from 0.05 to 0.15, typically 0.08, and
where the melt flow rate, described in ASTM D 1238, is in a range of from 1 to 100 (g/10 min.), preferably 1 to 50 (g/10 min.), more preferably, 2 to 30 (g/10 min.), and most preferably 5 to 25 (g/10 min.).

The FEP copolymer used in the present invention can be derived directly or indirectly from: (i.) 50, 55, 60, 65, 70 or 75 percent to about 75, 80, 85, 90 or 95 percent tetrafluoroethylene; and (ii.) 5, 10, 15, 20, or 25 percent to about 25, 30, 35, 40, 45 or 50 percent (generally 7 to 27 percent) hexafluoropropylene. Such FEP copolymers are well known and are described in U.S. Pat. Nos. 2,833,686 and 2,946,763.

4. "PTFE" is a polytetrafluoroethylene, including variations or derivatives thereof, derived in whole or in part from tetrafluoroethylene and having the following moiety representing at least 50, 60, 70, 80, 85, 90, 95, 96, 97, 98, 99 or about 100 weight percent of the entire polymer:

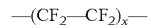

where x is equal to any natural number between 50 and 500,000.

5. "ETFE" is a poly(ethylene-co-tetrafluoroethylene), including variations or derivatives thereof, derived in whole or in part from ethylene and tetrafluoroethylene and having the following moiety representing at least 50, 60, 70, 80, 85, 90, 95, 96, 97, 98, 99, or about 100 weight percent of the entire polymer:

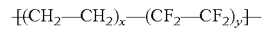

where x and y are mole fractions, where x is in a range from 0.40 to 0.60, typically 0.50, and where y is in a range from 0.40 to 0.60, typically 0.50, and
where the melt flow rate, described in ASTM D 1238, is in a range of from 1 to 100 (g/10 min.), preferably 1 to 50 (g/10 min.), more preferably, 2 to 30 (g/10 min.), and most preferably 5 to 25 (g/10 min.).

Fluoro-resins are generally known for their high-temperature stability, resistance to chemical attack, advantageous electrical properties (high-frequency properties in particular) low friction properties, and low tackiness. Other potentially useful fluoropolymer resins include (once converted to micro powders) the following:

1. chlorotrifluoroethylene polymer (CTFE)
2. tetrafluoroethylene chlorotrifluoroethylene copolymer (TFE/CTFE), 3. ethylene chlorotrifluoroethylene copolymer (ECTFE), and
4. polyvinylidene fluoride (PVDF).

In one embodiment, the fluoropolymer is a polytetrafluoroethylene (PTFE), such as is available from E.I. du Pont de Nemours and Company of Wilmington, Del., USA, under the commercial name of TEFLON®. A PTFE fluoropolymer resin is sold under the brand name ZONYL MP® by DuPont, having a grain size in the range of about 20 nanometers to 500 microns and an average particle size from 5 to 20 microns. Such a resin can be converted to a micro powder by additional particle size reduction or sieving.

Fluoropolymer resins can often be converted to micro powders by milling the resin in a hammer mill, or by using other mechanical means for reducing particle size. In one embodiment, the resin is cooled, such as with solidified carbon dioxide or liquid nitrogen, prior to grinding or other mechanical manipulation to decrease particle size. Some sieving may also be necessary, such as by sieving pulverized fluoropolymer resin through a 325-mesh screen (and optionally a 400-mesh screen filter). This ensures that the final fluoropolymer micro powder resin having a particle size between 20 nanometers and 5.0 microns. Useful starting materials for creating micro powders of the present invention include low molecular weight PTFE fluoropolymer sold by DuPont under the trade name ZONYL "Micronized" Powder® MP-1000, MP-1100, MP-1200, MP-1300, MP-1400, MP-1500, and MP-1600. The Table below shows some of the different properties of each "micronized" powder.

Once a stable dispersion of fluoropolymer micro powder is made, the dispersion can be filtered to remove larger particles that may not have dispersed very easily in the solvent or particles that may have agglomerated greater than 5.0 microns.

In one embodiment, the fluoropolymer dispersion is injected, and then blended, with the polyamic acid either in a batch method or in a continuous processing method. The two blended polymers can then be additionally filtered, or cast directly to form a filled polyamic acid sheet (only partially imidized under the heat of casting and drying).

The fluoropolymer micro powders of the present invention may posses either a high molecular weight species and/or a low molecular weight species. Depending upon the intended end use application, a lower molecular weight fluoropolymer can oftentimes be preferred. Generally speaking, low molecular weight fluoropolymers will more readily melt during the polyamic acid processing, will more easily form a compatible cured sheet, and will more readily migrate to the film surface during drying and curing. However, a higher molecular weight fluoropolymer may be desired, if a high degree of z-directional concentration uniformity is desired (between the fluoropolymer and the polyimide components).

In one embodiment of the present invention, the fluoropolymer component is dispersed in a polar organic solvent, such as, dimethylacetamide. Optionally, a small amount of polyamic acid is added to the fluoropolymer dispersion to help stabilize the slurry. In such an embodiment, the polyamic acid can be derived from pyromellitic

TABLE A

Typical physical properties of ZONYL MP ® "Micronized" powder [i.e. not a MICRO powder]:

|  | Mp1000 | Mp1100 | Mp1200 | Mp1300 | Mp1400 | Mp1500 | Mp1600 |
|---|---|---|---|---|---|---|---|
| Average size (micron) | 12 | 4 | 3 | 12 | 10 | 20 | 7 |
| Particle range (micron) | 3–30 | 0.3–8 | 1–9 | 3–25 | 3–20 | 10–35 | — |
| Surface area (m2/g) | 7–10 | 7–10 | 1.5–3.0 | 1.5–3.0 | 1.5–3.0 | 8–12 | 8–12 |
| Melting point (° C.) | 325 | 320 | 320 | 330 | 330 | 335 | 320 |

TABLE B

Typical physical properties of a MICRO-powder as defined herein:

|  | Mp1000 | Mp1100 | Mp1200 | Mp1300 | Mp1400 | Mp1500 | Mp1600 |
|---|---|---|---|---|---|---|---|
| Average size (micron) | 0.41 | 0.67 | 0.49 | 0.62 | 0.81 | 0.89 | 0.77 |
| Particle range (micron) | 0.1–0.7 | 0.3–1.2 | 0.2–0.9 | 0.1–1.0 | 0.3–2.5 | 0.3–5.0 | 0.3–4.6 |
| Melting point (° C.) | 325 | 320 | 320 | 330 | 330 | 335 | 320 |

In one embodiment of the present invention, the micro powder resin is dispersed in a solvent that is compatible with, or the same as, the polyimide precursor (polyamic acid). The fluoropolymer component is, if necessary, further dispersed or milled using a kinetic dispersion machine or any other common method, to keep the particles below 5.0 microns. This can be achieved by any particle dispersion technique like continuous media milling, ultra-sonicating, using a dispersing surfactant, kinetic dispersion, and the like, to form a micro powder-in-solvent fluoropolymer dispersion.

dianhydride (PMDA) and 4,4'-oxydianiline (4,4'-ODA) at substantially equimolar ratios.

The fluoropolymer micro powder slurry can be formed using the fluoropolymer component, the polar solvent, and optionally a small amount of polyamic acid. The resulting fluoropolymer micro powder slurry generally comprises the fluoropolymer component at a weight percent in a range between and including any two of the following: 0.5, 1.0, 2.0, 5.0, 10.0, 15.0, 20.0, 25.0, 30.0, 35.0, 40.0, 45.0 and 50.0 weight percent. The solids percent of the polyamic acid in the slurry can be in a range between and including any two of the following: 1, 2, 5, 7, 10, 15 and 20 percent. The slurry can also be milled and filtered to form a homogenous, stable dispersion. Next, a polyamic acid can be prepared at a solids concentration in a range between and including any two of the following: 10, 12, 14, 16, 18, 20, 22, 24, 26, 28, 30, 32, 34, 36, 38 and 40 weight percent.

The slurry can then be mixed with a polyamic acid solution to form a mixed polymer blend. The mixed polymer blend can be further subjected to shearing force to form a homogenous mixture and the mixed polymer can be filtered to remove large particle components. The mixed polymer can be cast onto a flat surface and dried to form a sheet. The sheet can be processed through a high temperature oven to invoke imidization of the polyamic acid to a polyimide.

To achieve low dissipation loss and low water absorption of the final composite film the weight percent loading of fluoropolymer component in the polyimide component should generally be greater than about 10, 15, 20, 25, or 30 weight percent. However, as weight percent loading of the fluoropolymer component increases the mechanical properties of the composite film tend to decline.

The polyamic acid of the present invention is preferably an aromatic polyamic acid prepared by copolymerizing substantially equimolar amounts of an aromatic tetracarboxylic dianhydride (or the dianhydride's acid ester or acid halide ester derivative) with an aromatic diamine component. In one example, the dianhydride component is 3,3',4,4'-biphenyltetracarboxylic dianhydride (i.e. 3,3',4,4'-BPDA) optionally blended with pyromellitic dianhydride (PMDA). In this same embodiment, the diamine component is p-phenylenediamine (PPD) optionally blended with a diaminodiphenyl ether like 3,4'-oxydianiline (3,4'-ODA) or 4,4'-oxydianiline (4,4'-ODA). The dianhydrides first may be blended together or added individually to either one, or blended with all of the diamines to form a polyamic acid polymer that is either a block (segmented) copolymer or a random copolymer.

In the films of the present invention, it may be desirable to select a polyimide derived from BPDA, PMDA, 4,4'-ODA and PPD monomers. These monomers, at certain ratios, can be adjusted to make a polyimide, and fluoropolymer/polyimide blend film, that has a coefficient of thermal expansion close to that of metal, particularly copper. This is ideal for flexible circuitry applications where low dissipation loss is an important property to achieve.

Examples of suitable tetracarboxylic dianhydrides (and functional derivatives thereof) that are useful in accordance with this embodiment of the present invention include:
1. pyromellitic dianhydride (PMDA);
2. 3,3',4,4'-biphenyl tetracarboxylic dianhydride (BPDA);
3. 3,3',4,4'-benzophenone tetracarboxylic dianhydride (BTDA);
4. 4,4'-oxydiphthalic anhydride (ODPA);
5. bis(3,4-dicarboxyphenyl)sulfone dianhydride (DSDA);
6. 2,2-bis(3,4-dicarboxyphenyl) 1,1,1,3,3,3,-hexafluoropropane dianhydride (6FDA);
7. 2,2'-bis[4-(3,4-dicarboxyphenoxy)phenyl]propane dianhydride (BPADA);
8. 2,3,6,7-naphthalene tetracarboxylic dianhydride;
9. 1,2,5,6-naphthalene tetracarboxylic dianhydride;
10. 1,4,5,8-naphthalene tetracarboxylic dianhydride;
11. 2,6-dichloronaphthalene-1,4,5,8-tetracarboxylic dianhydride;
12. 2,7-dichloronaphthalene-1,4,5,8-tetracarboxylic dianhydride;
13. 2,3,3',4'-biphenyl tetracarboxylic dianhydride;
14. 2,2',3,3'-biphenyl tetracarboxylic dianhydride;
15. 2,3,3',4'-benzophenone tetracarboxylic dianhydride;
16. 2,2',3,3'-benzophenone tetracarboxylic dianhydride;
17. 2,2-bis(3,4-dicarboxyphenyl)propane dianhydride;
18. 1,1-bis(2,3-dicarboxyphenyl)ethane dianhydride;
19. 1,1-bis(3,4-dicarboxyphenyl)ethane dianhydride;
20. bis(2,3-dicarboxyphenyl)methane dianhydride;
21. bis(3,4-dicarboxyphenyl)methane dianhydride;
22. 4,4'-(hexafluoroisopropylidene)diphthalic anhydride
23. bis(3,4-dicarboxyphenyl)sulfoxide dianhydride;
24. tetrahydrofuran-2,3,4,5-tetracarboxylic dianhydride;
25. pyrazine-2,3,5,6-tetracarboxylic dianhydride;
26. thiophene-2,3,4,5-tetracarboxylic dianhydride;
27. phenanthrene-1,8,9,10-tetracarboxylic dianhydride;
28. perylene-3,4,9,10-tetracarboxylic dianhydride;
29. bis-1,3-isobenzofurandione;
30. bis(3,4-dicarboxyphenyl)thioether dianhydride;
31. bicyclo-[2,2,2]-octen-(7)-2,3,5,6-tetracarboxylic-2,3,5,6-dianhydride;
32. 2-(3',4'-dicarboxyphenyl) 5,6-dicarboxybenzimidazole dianhydride;
33. 2-(3',4'-dicarboxyphenyl) 5,6-dicarboxybenzoxazole dianhydride;
34. 2-(3',4'-dicarboxyphenyl) 5,6-dicarboxybenzothiazole dianhydride;
35. bis(3,4-dicarboxyphenyl) 2,5-oxadiazole 1,3,4-dianhydride;
36. bis 2,5-(3',4'-dicarboxydiphenylether) 1,3,4-oxadiazole dianhydride;
37. and the like;
38. their acid, acid ester, and acid halide ester derivatives.

Representative dianhydrides which are particularly preferred in the present invention include pyromellitic dianhydride (PMDA), 4,4'-oxydiphthalic anhydride (ODPA), bis (3,4-dicarboxyphenyl)sulfone dianhydride, 2,2-bis(3,4-dicarboxyphenyl) 1,1,1,3,3,3,-hexafluoropropane dianhydride (6FDA), 2,2'-bis[4-(3,4-dicarboxyphenoxy) phenyl]propane dianhydride, 3,3',4,4'-benzophenonetetracarboxylic dianhydride (BTDA), and 3,3',4,4'-biphenyltetracarboxylic dianhydride (BPDA).

Examples of suitable aromatic diamines (and their functional derivatives thereof) useful in accordance with this embodiment of the present invention include:
1. 2,2 bis-(4-aminophenyl)propane;
2. 4,4'-diaminodiphenyl methane;
3. 4,4'-diaminodiphenyl sulfide;
4. 3,3'-diaminodiphenyl sulfone;
5. 4,4'-diaminodiphenyl sulfone;
6. 4,4'-diaminodiphenyl ether (4,4'-ODA);
7. 3,4'-diaminodiphenyl ether (3,4'-ODA);
8. 1,3-bis-(4-aminophenoxy)benzene (APB-134);
9. 1,3-bis-(3-aminophenoxy)benzene (APB-133);
10. 1,2-bis-(4-aminophenoxy)benzene;
11. 1,2-bis-(3-aminophenoxy)benzene;
12. 1,4-bis-(4-aminophenoxy)benzene;
13. 1,4-bis-(3-aminophenoxy)benzene;
14. 1,5-diaminonaphthalene;
15. 2,2'-bis(trifluoromethyl)benzidine;
16. 4,4'-diaminodiphenyldiethylsilane;
17. 4,4'-diaminodiphenylsilane;
18. 4,4'-diaminodiphenylethylphosphine oxide;
19. 4,4'-diaminodiphenyl-N-methyl amine;
20. 4,4'-diaminodiphenyl-N-phenyl amine;
21. 1,2-diaminobenzene (OPD);
22. 1,3-diaminobenzene (MPD);
23. 1,4-diaminobenzene (PPD);
24. 2,5-dimethyl-1,4-diaminobenzene;
25. 2,5-dimethyl-1,4-phenylenediamine (DPX);

26. trifluoromethyl-2,4-diaminobenzene;
27. trifluoromethyl-3,5-diaminobenzene;
28. 2,2-bis(4-aminophenyl) 1,1,1,3,3,3-hexafluoropropane (6F diamine);
29. 2,2-bis(3-aminophenyl) 1,1,1,3,3,3-hexafluoropropane;
30. benzidine;
31. 4,4'-diaminobenzophenone;
32. 3,4'-diaminobenzophenone;
33. 3,3'-diaminobenzophenone;
34. m-xylylene diamine;
35. p-xylylene diamine;
36. bisaminophenoxyphenylsulfone;
37. 4,4'-isopropylidenedianiline;
38. N,N-bis-(4-aminophenyl)methylamine;
39. N,N-bis-(4-aminophenyl) aniline
40. 3,3'-dimethyl-4,4'-diaminobiphenyl;
41. 4-aminophenyl-3-aminobenzoate;
42. 2,4-diaminotoluene;
43. 2,5-diaminotoluene;
44. 2,6-diaminotoluene;
45. 2,4-diamine-5-chlorotoluene;
46. 2,4-diamine-6-chlorotoluene;
47. 2,4-bis-(beta-amino-t-butyl)toluene;
48. bis-(p-beta-amino-t-butyl phenyl)ether;
49. p-bis-2-(2-methyl-4-aminopentyl)benzene;
50. 1-(4-aminophenoxy)-3-(3-aminophenoxy)benzene;
51. 1-(4-aminophenoxy)-4-(3-aminophenoxy)benzene;
52. 2,2-bis-[4-(4-aminophenoxy)phenyl]propane (BAPP);
53. bis-(4-(4-aminophenoxy)phenyl sulfone (BAPS);
54. 4,4'-bis(3-aminophenoxy)diphenylsulfone (m-BAPS);
55. 4,4'-bis-(aminophenoxy)biphenyl (BAPB);
56. bis(4-[4-aminophenoxy]phenyl)ether (BAPE);
57. 2,2'-bis-(4-phenoxy aniline)isopropylidene;
58. 2,4,6-trimethyl-1,3-diaminobenzene;
59. 4,4'-diamino-2,2'-trifluoromethyl diphenyloxide;
60. 3,3'-diamino-5,5'-trifluoromethyl diphenyloxide;
61. 4,4'-trifluoromethyl-2,2'-diaminobiphenyl;
62. 4,4'-oxy-bis-[(2-trifluoromethyl)benzene amine];
63. 4,4'-oxy-bis-[(3-trifluoromethyl)benzene amine];
64. 4,4'-thio-bis-[(2-trifluoromethyl)benzene-amine];
65. 4,4'-thiobis-[(3-trifluoromethyl)benzene amine];
66. 4,4'-sulfoxyl-bis-[(2-trifluoromethyl)benzene amine;
67. 4,4'-sulfoxyl-bis-[(3-trifluoromethyl)benzene amine];
68. 4,4'-keto-bis-[(2-trifluoromethyl)benzene amine];
69. and the like.

Preferred aromatic diamines include 1,4-diaminobenzene (PPD), 1,3-diaminobenzene (MPD), 4,4'-diaminodiphenyl ether (4,4'-ODA), 3,4'-diaminodiphenyl ether (3,4'-ODA), 1,3-bis-(4-aminophenoxy)benzene (APB-134), 1,3-bis-(3-aminophenoxy)benzene (APB-133), 2,2-bis-[4-(4-aminophenoxy)phenyl]propane (BAPP), bis-(4-(4-aminophenoxy)phenyl sulfone (BAPS), 4,4'-bis(3-aminophenoxy) diphenylsulfone (m-BAPS), 4,4'-bis-(aminophenoxy) biphenyl (BAPB), bis(4-[4-aminophenoxy]phenyl)ether (BAPE), 2,2'-bis(trifluoromethyl)benzidine, and 2,2-bis-(4-aminophenyl)-1,1,1,3,3-hexafluoro propane (6F diamine).

Aliphatic and cycloaliphatic diamines are also useful diamine monomers (typically as co-diamines) useful in making the polyamic acid precursors (and then the polyimides) of the present invention. Useful aliphatic diamines are 1,4-tetramethylenediamine, 1,5-pentamethylenediamine (PMD), 1,6-hexamethylenediamine (HMD), 1,7-heptamethylene diamine, 1,8-octamethylenediamine, 1,9-nonamethylenediamine, 1,10-decamethylenediamine (DMD), 1,11-undecamethylenediamine, 1,12-dodecamethylenediamine (DDD), 1,16-hexadecamethylenediamine. Useful cycloaliphatic diamines are para-amino cyclohexylmethane (PACM), isophorone diamine (IPD), and diaminocyclohexane (especially 1,4-diaminocyclohexane).

The diamines of the present invention may be used alone or in mixtures of two or more diamines. The diamines and the tetracarboxylic dianhydrides can be reacted by any conventional or non-conventional method to give a polyamic acid. Methods used to form polyamic acids are well known in the art and are not discussed herein.

The aromatic polyamic acid can be prepared by polymerizing substantially equimolar amounts of the aforesaid aromatic tetracarboxylic acid and aromatic diamine components at an appropriate polymerization temperature, such as 175° C. or less, more preferably about 90° C. or less, and most preferably 50° C. or less. This reaction takes place for about one minute to several days in an inert organic solvent depending on the temperature. The aromatic tetracarboxylic acid and aromatic diamine components can be added either neat, as a mixture or as solutions to the organic solvent or the organic solvent may be added to the components.

The organic solvent may dissolve one or all of the polymerizing components. The solvent should otherwise be substantially unreactive with all of the polymerizing components and with the polyamic acid and should be essentially free of impurities that could adversely effect the polymerization reaction.

Preferred solvents include normally liquid N,N-dialkylcarboxylamides, generally. Other preferred solvents include the lower molecular weight members of such carboxylamides, particularly N,N-dimethylformamide and N,N-dimethylacetamide. Still other useful compounds of this class of solvents are N,N-diethylformamide and N,N-diethylacetamide. Other solvents that may be useful include dimethylsulfoxide, N-methyl-2-pyrrolidone, N-cyclohexyl-2-pyrrolidone, tetramethyl urea, dimethylsulfone, hexamethylphosphoramide, tetramethylenesulfone, diglyme, pyridine and the like. The solvents can be used alone, in combinations with one another or in combinations with other less preferred or poorer solvents such as toluene, xylene, benzonitrile, and dioxane.

The amount of solvent used preferably ranges from 75 to 90 weight percent of the polyamic acid solution, since this concentration has been found to give optimum molecular weight/viscosity.

It is not required that the aromatic tetracarboxylic acid and the aromatic diamine components be used in absolute equimolar amounts. In order to adjust the molecular weight, the mole ratio of the tetracarboxylic acid component to the diamine component can range from 0.90 to 1.10, but is typically 0.98 to 1.02.

In one embodiment, the polyamic acid solution contains from 5 to 40 weight percent, preferably 10 to 25 weight percent, of polyamic acid polymer.

Once the polyamic acid and fluoropolymer are appropriately inter-dispersed, the polyamic acid linkages can be subjected to cyclo-dehydration, a ring-closing reaction, to obtain a polyimide. This is typically done by using a chemical conversion process or a thermal conversion process.

In a chemical conversion process, the polyamic acid solution is either immersed in or mixed with conversion chemicals. In this embodiment, the conversion chemicals are tertiary amine catalysts and anhydride dehydrating materials. A preferred anhydride dehydrating material is acetic anhydride, which is often used in molar excess of the amount of amic acid (amide acid) groups in the polyamic acid, typically about 2.0 to 2.4 moles per equivalent of polyamic acid. A comparable amount of tertiary amine catalyst is often used.

Besides acetic anhydride, other operable lower fatty acid anhydrides useful in the present invention include propionic, butyric, valeric, and mixed anhydrides of these with one another. Also, aromatic monocarboxylic acids are useful for example, benzoic acid, naphthoic acid, and the like, and with anhydrides or carbonic and formic acids, as well as aliphatic ketenes. Ketenes may be regarded as anhydrides of carboxylic acids derived from drastic dehydration of the acids.

The preferred tertiary amine catalysts are pyridine and beta-picoline and they are typically used in varying amounts from zero to several moles per mole of anhydride dehydrating material. Tertiary amines having approximately the same activity as the preferred pyridine and beta-picoline may also be used. These include alpha picoline; 3,4-lutidine; 3,5-lutidine; 4-methylpyridine; 4-isopropyl pyridine; N,N-dimethylbenzyl amine; isoquinoline; 4-benzyl pyridine, N,N-dimethyldodecyl amine, triethyl amine, and the like.

The conversion chemicals react at about room temperature or above to convert polyamic acid to polyimide. The chemical conversion reaction preferably occurs at temperatures from 15° C. to 120° C. with the reaction being very rapid at the higher temperatures and slow at the lower temperatures.

The chemically treated polyamic acid solution can be cast or extruded onto a heated conversion surface. The solvent is evaporated from the solution, and the polyamic acid is partially chemically converted to polyimide. The solution takes the form of a polyamic acid-polyimide gel. Alternately, the polyamic acid solution can be extruded into a bath of conversion chemicals consisting of an anhydride component and a tertiary amine component with or without a diluting solvent. Conversion of amic acid groups to imide groups depends on contact time and temperature but is usually about 25 to 75 percent complete.

The gel is self-supporting in spite of its high solvent content. The gel may or may not be treated by extraction, coating, or some other means. In one embodiment, it is subsequently dried to remove the water, residual solvent, and remaining conversion chemicals, and the polyamic acid is completely converted to polyimide. The drying can be conducted at relatively mild conditions without complete conversion of polyamic acid to polyimide at that time, or the drying and conversion can be conducted at the same time using higher temperatures.

Because the gel has so much liquid that must be removed during the drying and converting steps, the gel must be restrained during drying to avoid undesired shrinkage. In continuous production, the film can be held at the edges, such as in a tenter frame using tenter clips or pins for restraint.

When produced as a film, high temperatures can be used for short times to dry the film and convert it to a polyimide/fluoropolymer blend film in the same step. It is preferred to heat the film to a temperature of 200° C. to 550° C. for at least one second. Generally, less heat and time are required for thin films than for thicker films.

During such drying and converting, the film can be restrained from undue shrinking and, in fact, can be stretched by as much as 200 percent of its initial dimension. In film manufacture, stretching can be in either the longitudinal direction or the transverse direction or both. If desired, restraint can also be provided to permit some limited degree of shrinkage.

In another curing method, the polyamic acid/fluoropolymer micro powder mixed polymer is cast onto a metal foil. This is commonly called a cast-on-metal or cast-on-copper method. Here, the metal layer and the polymer are heated so that the polyamic acid is cured to a polyimide. The result is a polymer on metal product.

The polymer blend film composites of either the stand alone film, or the cast-on-metal product posses properties inherent to both the fluoropolymer resin (i.e. "low loss" and "low dielectric constant") and the polyimide resin (i.e. mechanical strength properties and chemical/thermal resistance). In the form of a stand alone film, the composites of the present invention can be useful as a wire wrap or an electronics type substrate such as a base film for a flexible circuit laminate. The films of the present invention may also be stacked in a multi-layer printed circuit board as a dielectric layer, or specifically a low loss layer.

The films of the present invention may also be useful as a resist layer material, "prepreg" material, sealing material for semiconductor package, a matrix for fiber reinforced composite material, membranes, or molding materials, etc.

In one embodiment of the present invention, the blended polyimide/fluoropolymer film (after curing) is laminated to a metal layer on one side or on both sides of the blend film. Commonly, the metal layer is in the form of a metal foil made of copper, nickel, titanium, or alloys of different metals.

In another process, the blend film can be cured and then metallized with a sputtering an electroplating operation to form a composite blend film-metal layer laminate. In this process, the blend film is first cured (i.e. the polyamic acid is cured to a polyimide) and then either sputter coated with a seed coat of metal and then electroplated, or simply laminated to an existing metal foil. In a sputtering operation, once a seed coat of metal is placed on either one side, or both sides of the blend composite film, a thicker coating of metal is then "plated-up" using an electroplating bath. Sputter and plating metalization operations (as well as cast-on-metal operations and metal foil lamination operations) are well known in the art and need not be fully described herein.

In other embodiments of the present invention, the polyimide/fluoropolymer compositions are incorporated into liquids, pastes, films, and other laminate substrates and/or the like, to be used for screen printing, solution coating, spray coating and injecting molding. The compositions of the present invention can be cast or co-extruded onto a film or printed circuit board, particularly films containing at least one other electrically conductive layer, for use (ultimately) as an interior layer in a flexible circuit.

Unlike conventional fluoropolymer resins, the composite fluoropolymer-polyimide resins of the present invention generally have excellent dimensional stability at high temperatures and when exposed to chemical solvents. The compositions of the present invention also have a coefficient of thermal expansion that is far more compatible with copper or other conductive layers. These compositions are more easily processible in high temperature processing (greater than 330° C.) and are more resistant to cold flow dimensional instability (i.e. creep).

In one embodiment, the polymeric composites of the present invention are in the form of a thin film. These films can have a thickness between and including any two of the following numbers 10, 20, 30, 40, 50, 60, 70, 80, 90, 100, 110, 120, 130, 140, 150, 160, 170, 180, 190 and 200 microns. The polyimide-fluoropolymer compositions, in the form of a film, provide a combination of advantageous properties as seen in the Tables below. In most formulations, depending on which fluoropolymer and which polyimide is chosen, a phase transition is observed if the fluoropolymer component is loaded above 60 weight percent. When the fluoropolymer component composition is high, the physical properties of the film more closely resemble a fluoropolymer film. When the fluoropolymer concentration is low (e.g., less than 15 weight percent in one embodiment) only modest changes to the polyimide film's physical properties are generally noticed.

In one embodiment of the present invention, over 50% of the surface of the substrate is fluoropolymer. In another embodiment, a majority of the fluoropolymer component along at least one side of the surface is a single continuous phase. In such an embodiment, the single continuous phase typically defines a thickness of at least 0.05, 0.1, 0.2, 0.3, 0.4, 0.5, 1, 2, 3, 4, 5, 6, 7, 8, 9, 10, 11, 12, 15, 20, 25, 50 or 60 microns.

In another embodiment, the substrate of the present invention has a total thickness in a range between and including any two of the following: 10, 20, 30, 40, 50, 60, 70, 80, 90, 100, 110, 120, 130, 140, 150, 160, 170, 180, 190 and 200 microns. In another embodiment, at least 20, 30, 40, 50, or 60 weight percent of the substrate is a single continuous phase. In another embodiment, at least 40, 50, 60, 70 or 80 weight percent of the substrate is defined by two discrete continuous phases. In another embodiment, the substrate provides a dielectric constant between and including any two of the following numbers: 2.0, 2.1, 2.2, 2.3, 2.4, 2.5, 2.6, 2.7, 2.8, 2.9, 3.0, 3.1, 3.2, 3.3, 3.4, or 3.5.

The substrates of the present invention can be incorporated into multilayer laminates, and/or incorporated into an integrated circuit device, such as, a level one packaging substrate for an integrated circuit. The substrates of the present invention can also be used in level 2 packaging as a substrate in a larger integrated circuit assembly.

In one embodiment, a substrate in accordance with the present invention directly or indirectly supports or protects an integrated circuit die and further comprises a conductive pathway on a surface, and alternatively (or in addition), provides a conductive pathway within or through the substrate. In one embodiment, a substrate in accordance with the present invention is used as a component of an IC packaging composition, such as, a chip on lead ("COL") package, a chip on flex ("COF") package, a lead on chip ("LOC") package, optoelectronic package, flat-wire applications, a multi-chip module ("MCM") package, a ball grid array ("BGA" or "μ-BGA") package, chip scale package ("CSP") or a tape automated bonding ("TAB") package.

Alternatively, a substrate in accordance with the present invention can be used as a component of a wafer level integrated circuit packaging substrate comprising a conductive passageway having one or more of the following: a wire bond, a conductive metal, and a solder bump.

In one embodiment, a substrate in accordance with the present invention is used in a high speed digital application, such as a substrate for a high speed digital antenna, or a substrate used in receiving or transmitting microwave signals (or transceiving microwave signals, i.e., both receiving and transmitting). "Microwave signals" are intended to mean electromagnetic wavelengths no larger than what has historically been referred to as "microwave," including wavelengths that are smaller than what has historically been referred to as microwave. The substrates of the present invention can also be incorporated into circuit boards, either flexible or rigid.

In alternative embodiments, a substrate in accordance with the present invention is used as all or part of a housing for one or more conductive wires or cables, such as a wire or cable wrap or as a housing component of a "flat wire" as commonly used in aerospace wiring applications.

The compositions of the present invention can optionally contain additional components such as rheological fillers, silicon gel, silica, carbon, dicalcium phosphate, alumina, titania, zeolite, air-sol products, (and/or other metal oxide filler). Other optional additives that may be useful, depending upon the particular embodiment of the present invention chose, include:

1. a solid lubricant (e.g., molybdenum disulfide, graphite, boron nitride, lead monoxide and lead powder);
2. one and more of reinforcing materials (i.e., glass fiber, carbon fiber, aromatic polyamide fiber, potassium titanate fiber, and glass beads);
3. antioxidants,
4. heat stabilizers,
5. ultra violet absorbers,
6. flame retardants,
7. flame retardant synergists,
8. anti-static agents,
9. lubricants,
10. liquid crystal polymers,
11. colorants, and
12. conventional or non-conventional additive useful to any embodiment of the present invention.

The polyimide resin composition of this invention may be molded by known processing methods such as injection molding, extrusion molding, rotation molding etc. and used for practical application.

The advantageous properties of this invention can be observed by reference to the following examples that illustrate, but do not limit, the invention. All parts and percentages are by weight unless otherwise indicated. In the discussion above and in the examples RH means relative humidity.

"Water absorption" of polyimide films was determined by placing three strips of film (about 1 inch by 5 inches in size) into a humidity oven set at 85° F., 85% relative humidity, for 48 hours. All of the strips of film were weighed before and after the humidity oven treatment. The average percentage for all three strips was recorded as the percent water absorption. This was done by thermal gravimetric analysis, at a rate of 10° C./minute from 35 to 180° C.

The fluoropolymer-polyimide blend films were subsequently laminated to roll-annealed copper at temperatures of 330° C. to 380° C. to form a polyimide/fluoropolymer-metal clad. "Peel strength" results, of the polyimide/fluoropolymer copper-clad laminates, were determined by ASTM method IPC-TM-650, Method No. 2.4.9D.

EXAMPLES 1–5

A slurry was prepared consisting of three components, a polyamic acid, a fluoropolymer micro powder and a polar solvent. 40 grams of dimethylacetamide solvent was added to a blender. ZONYL® Micronized Powder was hammer milled and sieved through both a 325 and 400-mesh screen filter to form micro powder derived from MP-1600. After the MP-1600 in "micro powder" was formed, 10 grams were weighted and added to the blender containing the solvent. The blender was started at low speed for 1 minute then increased to high speed for an additional minute. Ten grams of a 20 weight percent polyamic acid solution, dissolved in dimethylacetamide, was added to the blender and stirred for one minute. The polyamic acid solution was derived from a diamine and a dianhydride. In this case, the diamine was 4,4'-ODA and the dianhydride was PMDA.

Next, a high-viscosity polyamic acid solution was prepared using the same two monomers. First, a low-viscosity polyamic acid (about 50 poise) was prepared at a solution concentration of about 20 weight percent from PMDA and 4,4'-ODA (the 4,4'-ODA being in a slight stoichiometric excess). The low-viscosity fluoropolymer dispersion had added to it, a small amount of six weight percent PMDA solution until the low-viscosity polyamic acid solution reached a final viscosity of about 2000 poise.

Finally, the high-viscosity polyamic solution (at 2000 poise viscosity) was mixed with the fluoropolymer slurry at the predetermined concentrations in the Table 1 below. For purposes of this invention, these blends are known as "mixed polymer blends".

The mixed polymer was degassed under full vacuum for one hour to remove entrapped gas. All of the mixed polymer blends were cast separately onto glass plates using a metal casting bar and lines of tape on the glass plate to control the thickness of the cast film. A twenty-five micron thick layer of mixed polymer was cast onto the glass for each example.

Next, the glass plate was placed on a hot plate and heated to 90° C. for 30 minutes to remove excess solvent and to form a partially cured sheet. The partially dried film sheet was peeled from the glass plate and pinned into a metal frame to maintain mechanical tension on the edges of the film for final curing. The films were cured at 350° C. for 10 minutes in the metal frames to complete the imidization of the polyamic acid. A polyimide/fluoropolymer blend film was formed at the below concentrations.

TABLE 1

Fluoropolymer micro-powder filler loading and material balance sheet

| Final Film Conc. Loading of fluoropolymer in final polyimide (%) | Slurry Portion Breakdown | | | Polyamic Acid 20 weight percent high viscosity polyamic acid (g) |
|---|---|---|---|---|
| | Micro powder derived from ZONYL® MP-1600 (g) | DMAc (g) | 20 weight % polyamic acid from slurry (g) | |
| 20 (E-1) | 10 | 40.0 | 10 | 190 |
| 30 (E-2) | 17.2 | 68.6 | 10 | 190 |
| 40 (E-3) | 26.7 | 106.7 | 10 | 190 |
| 50 (E-4) | 40 | 160.0 | 10 | 190 |
| 60 (E-5) | 60 | 240.0 | 10 | 190 |

The following results were measured for EXAMPLES 1–5 above.

TABLE 2

Selected properties of polyimide films filled with a micro powder derived from Zonyl MP-1600

| Experimental Numbers | Loading of fluoropolymer component | Tensile Stress (Kpsi)/ Elongation (%) | Dielectric Constant/ Dissipation. Factor. at 1 M Hz | Dielectric Strength (V/mil) | Peel strength (pli) | CTE (ppm/K)/ Dim-stab (%) | Water absorption (%) |
|---|---|---|---|---|---|---|---|
| E-1 | FP-20% | 11.5/31.2 | 3.11/0.0019 | 3400 | 0.4 | 70.7/0.11 | 1.75% |
| E-2 | FP-30% | 10.5/32.2 | 3.01/0.0017 | 2900 | 1.6 | 60.0/0.07 | 1.27% |
| E-3 | FP-40% | 7.5/23.7 | 2.84/0.0015 | 2700 | 4.8 | 55.4/0.05 | 0.84% |
| E-4 | FP-50% | 5.6/22.4 | 2.61/0.0011 | 2800 | 6.3 | 71.3/0.09 | 0.69% |
| E-5 | FP-60% | 4.4/25.1 | 2.45/0.0009 | 3100 | 6.4 | 92.8/0.15 | 0.50% |

FP—fluoropolymer micro powder

EXAMPLES 6–10

EXAMPLES 6–10 were prepared in accordance with EXAMPLES 1–5. However, in these EXAMPLES, the fluoropolymer resin micro powder was derived from ZONYL® MP-1100 instead of MP-1600.

MP-1100 is a lower molecular weight "micronized" powder compared to MP-1600. Again, the polyamic acid prepared for both the fluoropolymer slurry and the high-viscosity polyamic acid was derived from substantially equimolar amounts of 4,4'-ODA and PMDA. The portions are described in Table 3.

TABLE 3

Fluoropolymer micro-powder filler loading and material balance sheet

| Final Film Conc. Loading of fluoropolymer micro powder in polyimide (wt. %) | Slurry Portion Breakdown | | | Polyamic Acid 20 weight percent high viscosity acid (g) |
|---|---|---|---|---|
| | Micro powder derived from ZONYL ® MP-1100 (g) | DMAc (g) | 20 weight % polyamic acid from slurry (g) | |
| 20 (E-6) | 10 | 40 | 10 | 190 |
| 30 (E-7) | 17.2 | 68.6 | 10 | 190 |
| 40 (E-8) | 26.7 | 106.7 | 10 | 190 |
| 50 (E-9) | 40 | 160 | 10 | 190 |
| 60 (E-10) | 60 | 240 | 10 | 190 |

The following results were measured for EXAMPLES 6–10.

TABLE 4

Selected properties of PMDA/4, 4ODA polyimide film filled with a micro powder derived from MP-1100

| Experimental Numbers | Loading of fluoropolymer component | Tensile Stress (Kpsi)/ Elongation (%) | Dielectric Constant/ Dissipation Factor at 1 MHz | Dielectric Strength (V/mil) | Peel strength (pli) | CTE (ppm/K)/ Dim-stab (%) | Water absorption (%) |
|---|---|---|---|---|---|---|---|
| E-6 | FP-20% | 12.1/24.5 | 3.09/0.0018 | 3000 | 0.8 | 65.8/0.12 | 1.34% |
| E-7 | FP-30% | 11.3/31.4 | 2.98/0.0017 | 2800 | 2.4 | 63.6/0.08 | 0.99% |
| E-8 | FP-40% | 7.7/18.8 | 2.81/0.0015 | 2500 | 3.9 | 55.0/0.06 | 0.78% |
| E-9 | FP-50% | 5.7/17.8 | 2.57/0.0010 | 2500 | 5.7 | 72.3/0.09 | 0.45% |
| E-10 | FP-60% | 3.4/10.7 | 2.40/0.0007 | 3000 | 6.1 | 93.9/0.18 | 0.38% |

FP—fluoropolymer micro powder

EXAMPLES 11–17

EXAMPLES 11–17 were prepared in accordance with EXAMPLES 1–5, however the monomers used to prepare the high-viscosity polyamic acid were altered. Instead of using and equimolar ratio of 4,4'-ODA and PMDA, three monomers were used.

In these EXAMPLES, a mixture of pyromellitic dianhydride (PMDA) and oxydiphthalic anhydride (ODPA) was used as the dianhydride component and an equimolar amount of APB-134 (aminophenoxybenzene) was used as the diamine component.

The resultant polyimide (i.e. a polyimide without a fluoropolymer component at all) would have a glass transition temperature in the range of about 210° C. to 240° C. and would be considered a thermoplastic polyimide. This polyimide is in stark contrast to a polyimide derived from 4,4'-ODA and PMDA having a glass transition temperature over 400° C. The polyamic acid used for the slurry preparation was derived from 4,4'-ODA and PMDA.

The fluoropolymer component for these EXAMPLES was maintained at a constant weight ratio to polyimide of about 50 weight percent. The type of fluoropolymer micro powders were adjusted, and were derived from a variety of low and high molecular weight fluoropolymer "micronized" powders (e.g. MP-1000 and MP-1100 and MP-1500 and MP-1600). Medium range molecular weight "micronized" powders (e.g. MP-1200, MP-1300 and MP-1400) were also used as starting materials prior to hammer milling to form micro powders. The results for these EXAMPLES are shown in Table 5.

TABLE 5

Selected properties of varying molecular weight micro powders in thermoplastic polyimide

| Experimental Numbers | Type of Zonyl MP ® converted into a Micro powder | Tensile Stress (Kpsi)/ Elongation (%) | Dielectric Constant/ Dissipation Factor at 1 M Hz | Dielectric Strength (V/mil) | Peel strength (pli) | CTE (ppm/K)/ Dim-stab (%) | Water absorption (%) |
|---|---|---|---|---|---|---|---|
| E-11 | MP1000-50% | 5.1/21.5 | 2.55/0.0013 | 2400 | 3.8 | 90.2/0.11 | 0.29% |
| E-12 | MP1100-50% | 5.7/17.8 | 2.57/0.0010 | 2500 | 5.7 | 72.3/0.09 | 0.35% |
| E-13 | MP1200-50% | 7.4/24.6 | 2.50/0.0012 | 2300 | 6.4 | 69.5/0.08 | 0.42% |
| E-14 | MP1300-50% | 12.7/32.5 | 2.51/0.0014 | 2100 | 7.9 | 53.0/0.06 | 0.48% |

TABLE 5-continued

Selected properties of varying molecular weight micro powders in thermoplastic polyimide

| Experimental Numbers | Type of Zonyl MP ® converted into a Micro powder | Tensile Stress (Kpsi)/ Elongation (%) | Dielectric Constant/ Dissipation Factor at 1 M Hz | Dielectric Strength (V/mil) | Peel strength (pli) | CTE (ppm/K)/ Dim-stab (%) | Water absorption (%) |
|---|---|---|---|---|---|---|---|
| E-15 | MP1400-50% | 11.4/27.3 | 2.53/0.0013 | 2300 | 6.7 | 58.1/0.07 | 0.50% |
| E-16 | MP1500-50% | 12.1/26.9 | 2.56/0.0014 | 2200 | 6.1 | 55/0.06 | 0.53% |
| E-17 | MP1600-50% | 13.0/28.5 | 2.60/0.0012 | 1800 | 6.3 | 54.1/0.06 | 0.51% |

EXAMPLES 18–20

The following EXAMPLES were prepared in accordance with EXAMPLES 1–5. However, the fluoropolymer in these EXAMPLES was not derived from "micronized" fluoropolymer powder commercially available (e.g. a ZONYL® MP product). These micro powders were derived (ground and sieved) from typical fluoropolymer resins sold by DuPont under the trade name TEFLON® and ZONYL®. TEFLON® resins typically have a much large particle size and have varying molecular weights. These resins require much more grinding time in a hammer mill and sieving to ultimately form a micro powder.

The fluoropolymer resins above were ground in order to reduce their average particle size. These three polymeric resins were mixed with 1:1 weight ratio dry ice and placed in a lab scale "hammer mill" for milling followed by sieving the milled powder through a 325-mesh screen. The resin was then passed through a 400-mesh screen several times.

The particle size of fluoropolymer polymer resin in these EXAMPLES was reduced to the range of 0.08 micron to 5 microns. The average particle size of these three EXAMPLES in particular was in from 0.4 to 0.8 microns. Some selected properties are shown in Table 6.

In EXAMPLE 18, a poly(tetrafluoroethylene-co-perfluoro[alkyl vinyl ether]) (PFA) fluoropolymer resin was used. Results are shown in Table 6.

COMPARATIVE EXAMPLE 1

A high-viscosity polyamic acid solution was prepared using 4,4'-ODA and PMDA at a substantially equimolar ratio. First, a low-viscosity polyamic acid (about 50 poise) was prepared at a solution concentration of about 20 weight percent. The low-viscosity solution had added to it, a six weight percent solution of PMDA. PMDA solution was added, and blended under high sheer with the low-viscosity polyamic acid, until the solution reached a final viscosity of about 2000 poise.

The high-viscosity polyamic solution was degassed under full vacuum for one hour to remove entrained gas. The polymer was cast onto glass plates using a metal casting bar and lines of tape on the glass plate to control the thickness of the cast film. A twenty-five micron thick layer of polymer was cast.

Next, the glass plate was placed on a hot plate and heated to 90° C. for 30 minutes to remove excess solvent and to form a partially cured sheet. The partially dried film sheet was peeled from the glass plate and pinned into a metal frame to maintain mechanical tension on the edges of the film for final curing. The film was cured at 350° C. for 10 minutes in the metal frames to complete the imidization of the polyamic acid. A pure polyimide film was formed with the following properties.

TABLE 6

Selected properties of varying micro powders in polyimide

| Experimental Numbers | Type of fluoropolymer component resin used | Tensile Stress (Kpsi)/ Elongation (%) | Dielectric Constant/ Dissipation Factor at 1 MHz | Dielectric Strength (V/mil) | Peel strength (pli) | CTE (ppm/K)/ Dim-stab (%) | Water absorption (%) |
|---|---|---|---|---|---|---|---|
| E-18 | PFA-50% | 14.5/30.4 | 2.47/0.0008 | 2900 | 8.1 | 37.1/0.04 | 0.29% |
| E-19 | ZONYL-50% | 11.2/21.4 | 2.49/0.0007 | 2500 | 6.3 | 41.2/0.05 | 0.36% |
| E-20 | TEFLON-50% | 10.2/17.3 | 2.45/0.0006 | 2200 | 5.2 | 82.4/0.10 | 0.36% |

TABLE 7

Pure Thermoset Polyimide Film Properties without any fluoropolymer resin filler

| Experimental Number | No fluoropolymer component used | Tensile Stress (Kpsi)/ Elongation (%) | Dielectric Constant/ Dissipation. Factor at 1 MHz | Dielectric Strength (V/mil) | Peel strength (pli) | CTE (ppm/K)/ Dim-stab (%) | Water absorption (%) |
|---|---|---|---|---|---|---|---|
| COMP-1 | FP-0% | 17.6/52.2 | 3.34/0.0018 | 5200 | not measured | 54.8/0.10 | 2.71% |

COMPARATIVE EXAMPLE 2

The following COMPARATIVE EXAMPLE was prepared in accordance with COMPARATIVE EXAMPLE 1, however the monomers used to prepare the high-viscosity polyamic acid were altered. Instead of using and equimolar ratio of 4,4'-ODA and PMDA, three monomers were used. In these examples, a mixture of pyromellitic dianhydride (PMDA) and oxydiphthalic anhydride (ODPA) was used as the dianhydride component and an equimolar amount of APB-134 (aminophenoxybenzene) was used as the diamine component.

The resultant polyimide (i.e. without a fluoropolymer component) would have a glass transition temperature in the range of about 210° C. to 240° C. This is in stark contrast to a polyimide derived from 4,4'-ODA and PMDA having no glass transition temperature. In other words, the polyimide used below was not a thermosetting polyimide but was a thermoplastic polyimide having a measurable glass transition temperature.

above, the fluoropolymer resins originally used in EXAMPLES 18–20 were not micro powder fluoropolymers at the start. At the start, these fluoropolymer resins had a large particles size in the range of from 200 to 500 micron. In the COMPARATIVE EXAMPLES below, these fluoropolymers were not ground to a smaller particle size range. As such, the data below represents the outcome of using standard fluoropolymer resin components. These fluoropolymers are commercial sold under common trade names like TEFLON® and ZONYL®.

The blend films had a very rough surface and some of the resin, as a filler component, was still in "resin form" in the final film (i.e. chunks of fluoropolymer dispersed in the film).

Complete evaluation of these films was impossible due to the poor film quality. The mechanical properties (i.e. tensile

TABLE 8

A Thermoplastic Polyimide with no fluoropolymer component

| Experimental Number | No fluoropolymer component used | Tensile Stress (Kpsi)/ Elongation (%) | Dielectric Constant/ Dissipation Factor at 1 MHz | Dielectric Strength (V/mil) | Peel strength (pli) | CTE (ppm/K)/ Dim-stab (%) | Water absorption (%) |
|---|---|---|---|---|---|---|---|
| COMP-2 | FP-0% | 18.2/73.4 | 3.40/0.0016 | 5000 | 8.2 | 63.9/0.13 | 0.98% |

COMPARATIVE EXAMPLES 3–5

The following COMPARATIVE EXAMPLES were prepared in accordance with EXAMPLES 18–20. As stated strength and percent elongation) are poor and are listed as listed in Table-9. The rough surface topography and non-uniform thickness of the film will limit, if not destroy, use especially in high frequency applications.

TABLE 9

Selected properties of varying fluoropolymer resins in polyimide (non-micro powders)

| Experimental Numbers | Type of fluoropolymer component used | Tensile Stress (Kpsi)/ Elongation (%) | Dielectric Constant/ Dissipation Factor at 1 MHz | Dielectric Strength (V/mil) | Peel strength (pli) | CTE (ppm/K)/ Dim-stab (%) | Water absorption (%) |
|---|---|---|---|---|---|---|---|
| COMP-3 | PFA-50% | 7.4/4.1 | Not measured | 890 | Not measured | Not measured | Not measured |
| COMP-4 | ZONYL-50% | 2.5/4.0 | Not measured | 1360 | Not measured | Not measured | Not measured |
| COMP-5 | TEFLON-50% | 5.7/4.7 | Not measured | 650 | 6.4 | Not measured | Not measured |

COMPARATIVE EXAMPLES 6 AND 7

The following COMPARATIVE EXAMPLES were prepared in accordance with EXAMPLES 1–5. The fluoropolymer resins for these COMPARATIVE EXAMPLES were "micronized powder", ZONYL MP® powders that were not ground to a finer particle size. As such, the data in Table 10 below represents the outcome of using standard fluoropolymer "micronized powder" resins as the fluoropolymer component. These "micronized powders" were not ground and sieved to form a micro powder.

These fluoropolymers are commercial sold under common trade name ZONYL MP®. The blend films formed had a relatively smooth surface, however the level of migration of the fluoropolymer to the films surface was less than in the EXAMPLES. This was evidenced by the moisture absorption data in Table 10 below. In other words, the protective barrier of fluoropolymer, at the film's surface, was not fully formed as compared to the EXAMPLES.

TABLE 10

Selected properties of varying ZONYL MP ® "Micronized" powders in polyimide (i.e. non-micro powder)

| Experimental Numbers | Type of fluoropolymer component used | Tensile Stress (Kpsi)/ Elongation (%) | Dielectric Constant/ Dissipation Factor at 1 MHz | Dielectric Strength (V/mil) | Peel strength (pli) | CTE (ppm/K)/ Dim-stab (%) | Water absorption (%) |
|---|---|---|---|---|---|---|---|
| COMP-6 | MP1600-30% | 8.7/26.3 | 3.03/0.0023 | Not measured | Not measured | Not measured | 2.7% |
| COMP-7 | MP1600-50% | 6.5/23.8 | 2.78/0.0022 | Not measured | 5.8 | Not measured | 2.1% |

What is claimed is:

1. A single layer substrate useful for electronic or electrical applications either alone or as a component of a multilayer structure, the single layer substrate comprising a polymeric blend of at least a polyimide component and a fluoropolymer component, wherein:
   a. the fluoropolymer component is present in a range between and including any two of the following: 9, 10, 15, 20, 25, 30, 25, 40, 45, 50, 55, 60, 65, 70, 75, 80, 90, 95, 100, 110 and 120 weight parts per 100 weight parts polyimide component, and
   b. the fluoropolymer component;
      i. is derived from a fluoropolymer micro powder having an average particle size in a range between and including any two of the following: 5, 4, 3, 2, 1, 0.8, 0.6, 0.5, 0.4, 0.3, 0.2, 0.1, 0.08, 0.06, 0.04, or 0.02 microns;
      ii. has a melting temperature less than or equal to 375, 370, 365, 350, 325, 300, 280, 275, 265 or 250° C.;
   c. wherein the single layer substrate has an outer surface and an interior core, the outer surface comprising an amount of fluoropolymer component greater than the amount of fluoropolymer component present in the interior core; and the interior core comprising an amount of polyimide component greater than the amount of polyimide component present at the outer surface.

2. A single layer substrate in accordance with claim 1, wherein the single continuous phase defines a thickness of at least 0.05, 0.1, 0.2, 0.3, 0.4, 0.5, 1, 2, 3, 4, 5, 6, 7, 8, 9, 10, 11, 12, 15, 20, 25, 50 or 60 microns.

3. A single layer substrate in accordance with claim 2, having a water absorption value being in a range between and including any two of the following: 0.1, 0.2, 0.3, 0.4, 0.5, 0.6, 0.7, 0.8, 0.9, 1.0, 1.1, 1.2, 1,3, 1.4, 1.5, 1.6, 1.7, and 1.75.

4. A single layer substrate in accordance with claim 3, wherein the substrate is created in part by combining a polyimide precursor solution and the fluoropolymer micro powder and subjecting the combination to a shear and a temprature sufficient to reduce fluoropolymer micro powder agglomeration to an average of less than 5, 4, 3, 2.5, 2, 1, 0.5, 0.2, 0.1, 0.05, or 0.02 microns.

5. A single layer substrate in accordance with claim 4, wherein, the substrate is laminated to a metal.

6. A single layer substrate in accordance with claim 5, having a water absorption value between and including any two of the following numbers, 0.1, 0.2, 0.3, 0.4, 0.5, 0.6, 0.7, 0.8, 0.9, 1.0 1.1, 1.2, 1.3, 1.4, 1.5, 1.6, 1.7, and 1.75 percent, and a dissipation loss being in a range from 0.0005 to 0.0020 at 1 MHz.

7. A single layer substrate in accordance with claim 1, the substrate having a total thickness in a range between and including any two of the following: 10, 20, 30, 40, 50, 60, 70, 80, 90, 100, 110, 120, 130, 140, 150, 160, 170, 180, 190 and 200 microns.

8. A single layer substrate in accordance with claim 7, wherein at least 20, 30, 40, 50, or 60 weight percent of the substrate is a single continuous phase comprising either the polyimide component or the fluoropolymer component.

9. A single layer substrate in accordance with claim 7, wherein at least 40, 50, 60, 70 or 80 weight percent of the substrate is defined by a first phase and a second phase, both phases being discrete continuous phases, the first phase being a polyimide and the second phase being a fluoropolymer.

10. A single layer substrate in accordance with claim 1, wherein the polyimide component is derived from a polyamic acid precursor created at least in part by contacting one or more dianhydride components with one or more diamine components, the dianhydride component being selected from a group consisting of: pyromellitic dianhydride, 4,4'-oxydiphthalic anhydride, bis(3,4-dicarboxyphenyl)sulfone dianhydride, 2,2-bis(3,4-dicarboxyphenyl) 1,1,1,3,3,3,-hexafluoropropane dianhydride (6FDA), 2,2'-bis[4-(3,4-dicarboxyphenoxy)phenyl]propane dianhydride, 3,3',4,4'-benzophenonetetracarboxylic dianhydride, 3,3',4,4'-biphenyltetracarboxylic dianhydride, and combinations thereof.

11. A single layer substrate in accordance with claim 1, wherein the polyimide component is derived from a polyamic acid precursor created at least in part by contacting one or more dianhydride components with one or more diamine components, the diamine component being selected from a group consisting of: 1,4-diaminobenzene, 1,3-diaminobenzene, 4,4'-diaminodiphenyl ether (4,4'-ODA), 3,4'-diaminodiphenyl ether (3,4'-ODA), 1,3-bis-(4-aminophenoxy) benzene (APB-134), 1,3-bis-(3-aminophenoxy) benzene (APB-133), 2,2-bis-[4-(4-aminophenoxy)phenyl] propane (BAPP), bis-(4-(4-aminophenoxy)phenyl sulfone (BAPS), 4,4'-bis(3-aminophenoxy)diphenylsulfone (m-BAPS), 4,4'-bis-(aminophenoxy)biphenyl (BAPB), bis (4-[4-minophenoxy]phenyl)ether (BAPE), 2,2'-bis-(4-aminophenyl)-1,1,1,3,3-hexafluoro propane (6F diamine), and combinations thereof.

12. A single layer substrate in accordance with claim 1, wherein the fluoropolymer component is derived from a fluoropolymer component selected from the group comprising tetrafluroethylene perfluoroalkylvinylether copolymer (PFA), chlorotrifluoroethylene polymer (CTFE), tetrafluoroethylene chlorotrifluoroethylene copolymer (TFE/CTFE), ethylene chlorotrifluoroethytene copolymer (ECTFE), and polyvinylidene fluoride (PVDF), poly(tetrafluoroethylene-co-hexafluoropropylene) (FEP), polytetrafluoroethylene (PTFE), and poly(ethylene-co-tetrafluoroethylene) (ETFE).

13. A single layer substrate in accordance with claim 1, wherein the dielectric constant of the substrate is between and including any two of the following numbers: 2.0, 2.1, 2.2, 2.3, 2.4, 2.5, 2.6, 2.7, 2.8, 2.9, 3.00, 3.1, 3.2, 3.3, 3.4, and 3.5.

14. A single layer substrate in accordance with claim 1, said substrate comprising all or part of a high speed digital antenna.

15. A single layer substrate in accordance with claim 1, said substrate being a component of a microwave receiver, a microwave transmitter or a microwave transceiver.

16. A single layer substrate in accordance with claim 1, said substrate being a component of a multilayer flexible or rigid circuit board.

17. A single layer substrate in accordance with claim 1, said substrate being a component of a level one or level two circuit package.

18. A single layer substrate in accordance with claim 1, said substrate comprising all or part of a housing for one or more conductive wires or cables.

19. A single layer substrate in accordance with claim 1, further comprising a filler.

20. A single layer substrate in accordance with claim 1, further comprising a filler selected from a group consisting of a silicon gel, a silica, a carbon, a zeolite, an air-sol product, and a metal oxide.

21. A single layer substrate in accordance with claim 1, further comprising a filler selected from the group consisting of dicalcium phosphate, alumina, and titania.

22. A substrate in accordance with claim 1, wherein the substrate is a component of a packaging composition, the packaging composition being a chip on lead ("COL") package, a chip on flex ("COF") package, a lead on chip ("LOC") package, a multi-chip module ("MCM") package, optoelectronic package, flat-wire applications, a ball grid array ("BGA" or "μ-BGA") package, chip scale package ("CSP") or a tape automated bonding ("TAB") package.

23. A substrate in accordance with claim 1, wherein the substrate is a component of a integrated circuit packaging substrate comprising a conductive passageway, said passageway comprising one or more members of the following group: a wire bond, a conductive metal, and a solder bump.

* * * * *